United States Patent [19]
Jeng

[11] Patent Number: 5,789,289
[45] Date of Patent: Aug. 4, 1998

[54] METHOD FOR FABRICATING VERTICAL FIN CAPACITOR STRUCTURES

[75] Inventor: Erik S. Jeng, Taipei, Taiwan

[73] Assignee: Vanguard International Semiconductor Corporation, Hsinchu, Taiwan

[21] Appl. No.: 665,601

[22] Filed: Jun. 18, 1996

[51] Int. Cl.$^6$ .............................................. H01L 21/8242
[52] U.S. Cl. .............................................. 438/253; 438/396
[58] Field of Search ........................... 437/60, 52, 47–48, 437/919; 438/210, 239, 253, 329, 396

[56] References Cited

U.S. PATENT DOCUMENTS

| 5,185,282 | 2/1993 | Lee et al. | 437/47 |
| 5,296,400 | 3/1994 | Park et al. | 437/52 |
| 5,481,127 | 1/1996 | Ogawa | 257/308 |
| 5,554,557 | 9/1996 | Koh | 437/52 |

OTHER PUBLICATIONS

"Silicon Processing for the VLSI Era Volume 2–Process Integration" by S. Wolf, Lattice Press, pp. 327–333, 1990.

Primary Examiner—John Niebling
Assistant Examiner—Joni Y. Chang
Attorney, Agent, or Firm—Meltzer, Lippe, Goldstein, et al.

[57] ABSTRACT

A unique DRAM structure has increased capacitance by using a parallel fin capacitor structure. A preferred embodiment of the invention includes a silicon substrate having a first conductivity type. Field oxide (FOX) regions are defined in the substrate to separate DRAM cells. Drain and source regions are formed in the substrate by forming in the substrate regions. On the substrate surface and between the drain and source, a gate region is formed. The gate region comprises a gate oxide, a first polysilicon layer (Poly-1) doped to have a second conductivity type opposite the first conductivity type, a tungsten silicide (WSi) layer, and an oxide layer, such as $SiO_2$ or SiN. Oxide or TEOS (tetraethylorthosilicate) spacers cover the sides of the gate region. Above the gate region is an insulating layer of TEOS. A second polysilicon layer (Poly-2) having the second conductivity type contacts the source region and forms a bitline. Layers of WSi, oxide or thin TEOS, and $Si_yN_x$, such as $Si_3N_4$, cover the bitline. The sides of the bitline are covered with TEOS spacers. Small TEOS regions contact portions of the drain and source regions. A capacitor having a parallel fin structure contacts the drain region. The capacitor comprises a third polysilicon layer (Poly-3) doped to the second conductivity type, a thin dielectric layer, such as a nitride film/oxide film (NO) or an oxide film/nitride film/oxide film (ONO), and a fourth polysilicon layer (Poly-4) doped to the second conductivity type. Efficient methods for fabricating the DRAM are disclosed.

17 Claims, 9 Drawing Sheets

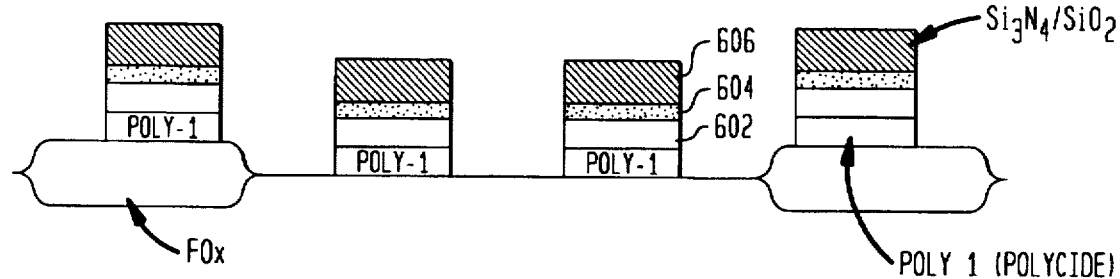
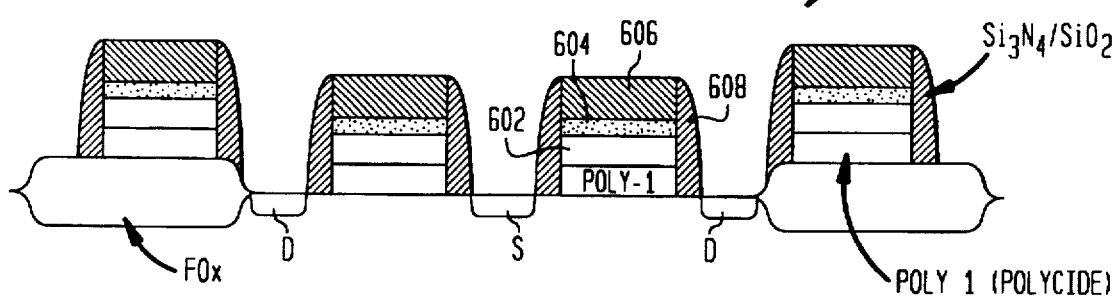
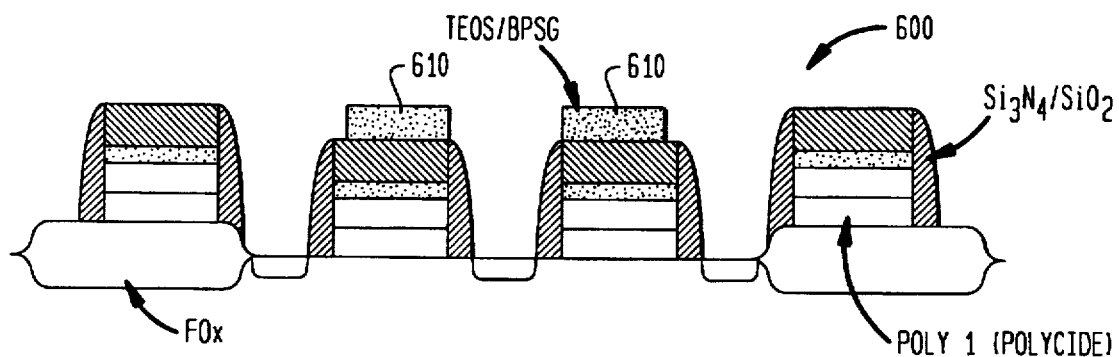
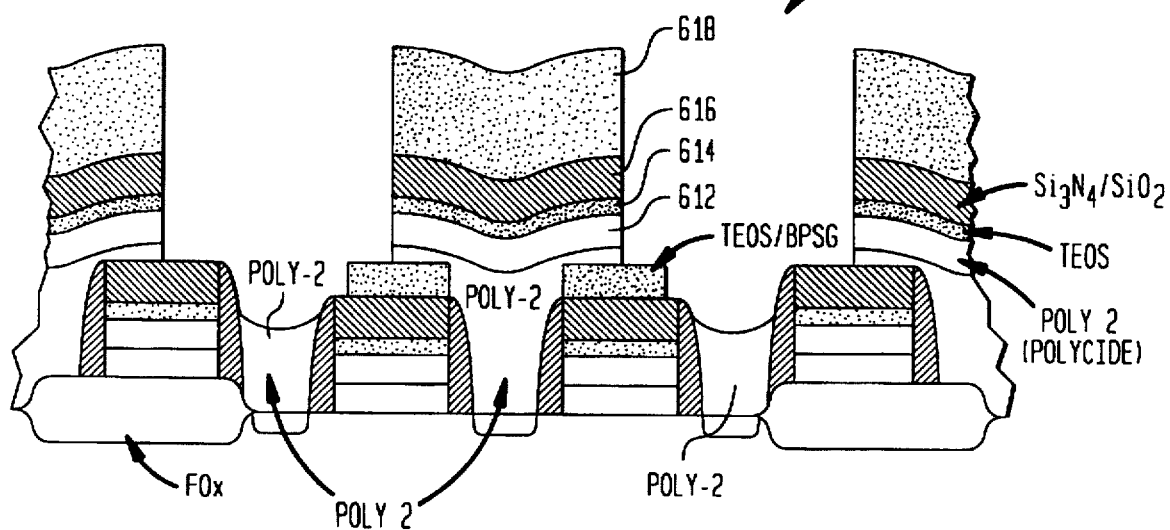

METHOD FOR FABRICATING VERTICAL FIN CAPACITOR STRUCTURES

BACKGROUND OF THE INVENTION

1. Field of the Invention

The present invention relates to a unique dynamic random access memory (DRAM) device structure and method of manufacturing it and, more particularly, to a vertical fin capacitor structure for DRAMs and methods of manufacturing these structures.

2. Related Application

A concurrently filed patent application entitled "Method for Fabricating A Four Fin Capacitor Structure", Ser. No. 08/665,602 contains information related to this patent application. The contents of that patent application are incorporated herein by reference.

3. Discussion of Related Art

A DRAM memory typically comprises a transistor and a capacitor. Binary information (e.g., a 0 or 1) is stored in the capacitor in the form of an electric charge. Capacitors do not store electric charges perfectly and lose their charge if not refreshed on a regular basis, such as every 2 ms. The capacitors, however, allow information (in the form of electrical charges) to be quickly stored and accessed.

FIG. 1 illustrates a typical DRAM cell 100. The DRAM cell 100 of FIG. 1 comprises a metal oxide semiconductor field effect transistor (MOSFET) 102, and a capacitor 104. A word line is connected to the gate G of the MOSFET 102. A bitline is connected to the source S of the MOSFET 102. The capacitor 104 is connected to the drain D of the MOSFET.

The state of the DRAM cell 100 is determined by whether or not the capacitor 104 is holding an electrical charge. The DRAM cell is addressed (i.e., activated) by the word line. When the DRAM cell is activated, it may be read or written into. The DRAM cell 100 is read by using the bitline to determine whether a voltage appears at the source S, indicating the presence or absence of a charge stored in the capacitor 104. The DRAM cell is written into by using the bitline to add or remove charge from the capacitor 104.

As DRAM technology advances, the chip area used for one DRAM cell is becoming smaller. This permits more DRAM cells per unit area, resulting in a memory array storing more information in the same area as was possible in previous memory arrays. As the chip area decreases, however, the traditional T-shaped capacitors or solid node capacitors become too small to have sufficient capacitance. It becomes increasingly difficult to fabricate a capacitor having sufficient capacitance to store a charge for a sufficient time.

Two methods may be used to increase the capacitance of a DRAM cell capacitor. One method is to decrease the effective dielectric thickness of the capacitor; the other method is to increase the effective capacitor surface area. It is expected that future DRAM cells will rely heavily on the quality and storage capacity of ultra thin dielectric materials that are sandwiched between two heavily doped polysilicon and/or silicon electrodes. However, higher capacitance values cannot be obtained by using very thin dielectric material without seriously degrading the device retention time (that is, the time between refreshes). This is because films thinner than 50 Angstroms present excessive leakage current due to direct carrier tunneling. Therefore, in order to design smaller DRAM cells, it is desirable to increase the surface area of the DRAM cell capacitor to result in a capacitance capable of storing a charge for a sufficient time. Designing such a DRAM cell is challenging because of the conflicting design characteristics: the overall cell size is preferably minimized while the capacitor surface area is preferably maximized.

It is an object of the present invention to provide a DRAM having increased capacitance by increasing the surface area of the capacitor.

It is another object of the present invention to provide a DRAM having vertical fin capacitor structures.

SUMMARY OF THE INVENTION

These and other objects of the present invention are achieved by a unique DRAM having a parallel fin capacitor structure and efficient methods for fabricating the DRAM.

A first embodiment of the inventive DRAM cell is formed on a silicon substrate having a first conductivity type. Field oxide (FOX) regions are defined in the substrate to separate DRAM cells. Drain and source regions are formed in the substrate. On the substrate surface and between the drain and source, a gate region is formed. The gate region comprises a gate oxide, a first polysilicon layer (Poly-1) doped to have a second conductivity type opposite the first conductivity type, a tungsten silicide (WSi) layer, and an insulating layer, such as $SO_2$ or SiN. Oxide or TEOS (tetraethylorthosilicate) spacers cover the sides of the gate region. Above the gate region is an insulating layer of TEOS. A second polysilicon layer (Poly-2) having the second conductivity type contacts the source region and forms a bitline. Layers of WSi, oxide or thin TEOS, and $Si_yN_x$, such as $Si_3N_4$, cover the bitline. The sides of the bitline are covered with TEOS spacers. Small TEOS regions contact portions of the drain and source regions.

A capacitor having a parallel fin structure contacts the drain region. The capacitor comprises a third polysilicon layer (Poly-3) doped to the second conductivity type, a thin dielectric layer, such as a nitride film/oxide film (NO) or an oxide film/nitride film/oxide film (ONO), and a fourth polysilicon layer (Poly-4) doped to the second conductivity type.

This first embodiment of the inventive DRAM is fabricated as follows:

1. FOX regions are defined in the substrate to separate adjacent cells.
2. For each cell, a gate is created using a first polysilicon layer (Poly-1).
3. Gate spacers are created on the sides of the gate and, using the gate and gate spacers as a mask, a conductive region is made in the exposed substrate to form the DRAM source and drain regions.
4. The cell is covered with TEOS and masked and etched to expose the source region.
5. A bitline is created using a second polysilicon layer (Poly-2), which contacts the exposed source region. A thick oxide layer extends above the bitline. This thick layer is used to "build" the parallel fin capacitors. The exposed TEOS is etched away and bitline spacers are formed on the sides of the bitline.
6. A third polysilicon layer (Poly-3) is deposited over the entire cell—including the exposed drain region and thick oxide layer—and etched to create a first capacitor electrode in contact with the drain.
7. The entire cell is covered with oxide. The oxide is partially etched to expose a top portion of the Poly-3 layer. The exposed portion of the Poly-3 layer is etched off. This separates the Poly-3 layer into separate capacitor electrodes.

8. The thick oxide layer is removed. A dielectric is deposited over the electrode and another layer of polysilicon (Poly-4) is deposited over the dielectric to form the second capacitor electrode.

A second embodiment of the inventive DRAM cell is formed on a silicon substrate having a first conductivity type. Field oxide (FOX) regions are defined in the substrate to separate DRAM cells. Drain and source regions are formed in the substrate. On the substrate surface and between the drain and source, a gate region is formed. The gate region comprises a gate oxide, a Poly-1 layer doped to have a second conductivity type opposite the first conductivity type, a tungsten silicide (WSi) layer, an oxide layer, and a $SiO_2$ or SiN layer. $SiO_2$ or SiN spacers cover the sides of the gate regions. Above the gate region is an insulating layer of TEOS or BPSG (borophosphosilicate). A Poly-2 layer having the second conductivity type contacts the source and drain regions. The Poly-2 layer forms a bitline where it contacts the source region. Layers of WSi, thermal oxide or thin TEOS, and $Si_yN_x$, such as $Si_3N_4$, cover the bitline. The sides of the bitline are covered with $Si_yN_x$ spacers.

A capacitor having a parallel fin construction contacts the Poly-2 layer contacting the drain region. The capacitor comprises a Poly-3 layer doped to the second conductivity type, a thin dielectric layer, such as NO or ONO, and a Poly-4 layer doped to the second conductivity type.

This second embodiment of the inventive DRAM is fabricated as follows:

1. FOX regions are defined in the substrate to separate adjacent cells.
2. For each cell, a gate is created using a Poly-1 layer.
3. Gate spacers are created on the sides of the gate and, using the gate and gate spacers as a mask, a conductive region is made in the exposed substrate to form the DRAM source and drain regions.
4. The cell is covered with TEOS and masked and etched to expose the source region and drain regions, leaving TEOS only over the gates adjacent to the source region.
5. A Poly-2 layer is deposited to contact the exposed drain and source regions. The Poly-2 that contacts the exposed source region forms a bitline. A thick oxide layer extends above the bitline. This thick layer is used to "build" the parallel fin capacitors. Bitline spacers are formed on the sides of the bitline.
6. A third polysilicon layer (Poly-3) is deposited over the entire cell—including the exposed Poly-2 layer over the drain region and the thick oxide layer—and is etched to create a first capacitor electrode.
7. The entire cell is covered with oxide. The oxide is partially etched to expose a top portion of the Poly-3 layer. The exposed portion of the Poly-3 layer is etched off. This separates the Poly-3 layer into separate capacitor electrodes.
8. The thick oxide layer is removed. A dielectric is deposited over the electrode and a Poly-4 layer is deposited over the dielectric to form the second capacitor electrode.

This method does not require separate deposition/etching steps to first expose the source and form the bitline, and then expose the drain and form the capacitor. Thus, this second DRAM cell manufacturing process requires fewer processing steps than the first method.

BRIEF DESCRIPTION OF THE DRAWINGS

The present invention is described with reference to the following figures:

FIGS. 6A–6H illustrate a second embodiment of a DRAM according to the present invention and a preferred method of manufacturing it.

DETAILED DESCRIPTION OF PREFERRED EMBODIMENT

Figure 1:
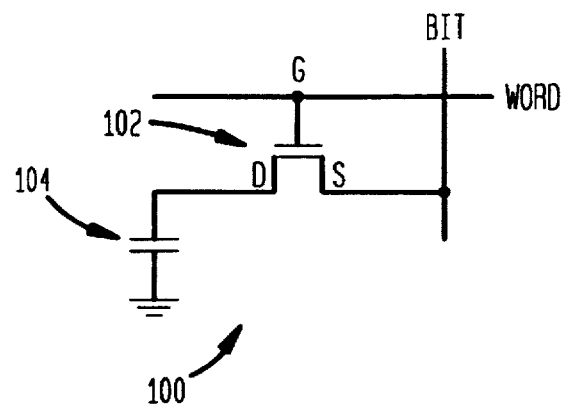
FIG. 1 is a schematic diagram illustrating a DRAM.
Figure 2:
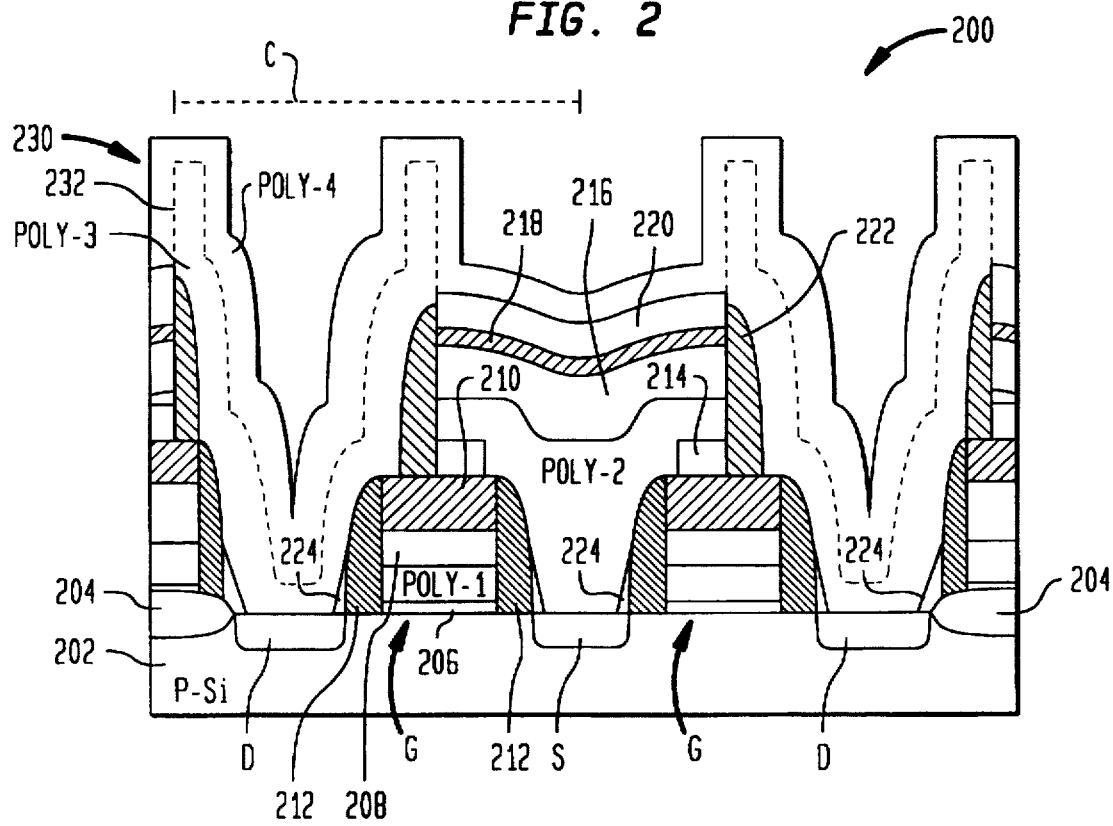
FIG. 2 is a cross-sectional view of a first embodiment of a DRAM according to one embodiment of the present invention.

FIG. 2 is a cross-sectional view of a first preferred embodiment of a DRAM having parallel fin capacitors according to the present invention. FIG. 2 shows two DRAM cells sharing a single source. A dashed line C indicates a structure of a single cell. In this embodiment, the cell 200 is formed on a p-type silicon substrate 202. Field oxide (FOX) regions 204 are defined in the substrate 202 to separate DRAM cells. Drain and source regions (D,S) are formed in the substrate. On the substrate surface and between the drain and source, a gate region (G) is formed. The gate region comprises a gate oxide 206, a first polysilicon layer (Poly-1) doped to have a n-type conductivity, a tungsten silicide (WSi) layer 208, an insulting layer 210, such as $SiO_2$ or SiN. Oxide or TEOS (tetraethylorthosilicate) spacers 212 cover the sides of the gate regions. Above the gate region is an insulating layer of TEOS 214.

Figure 3:
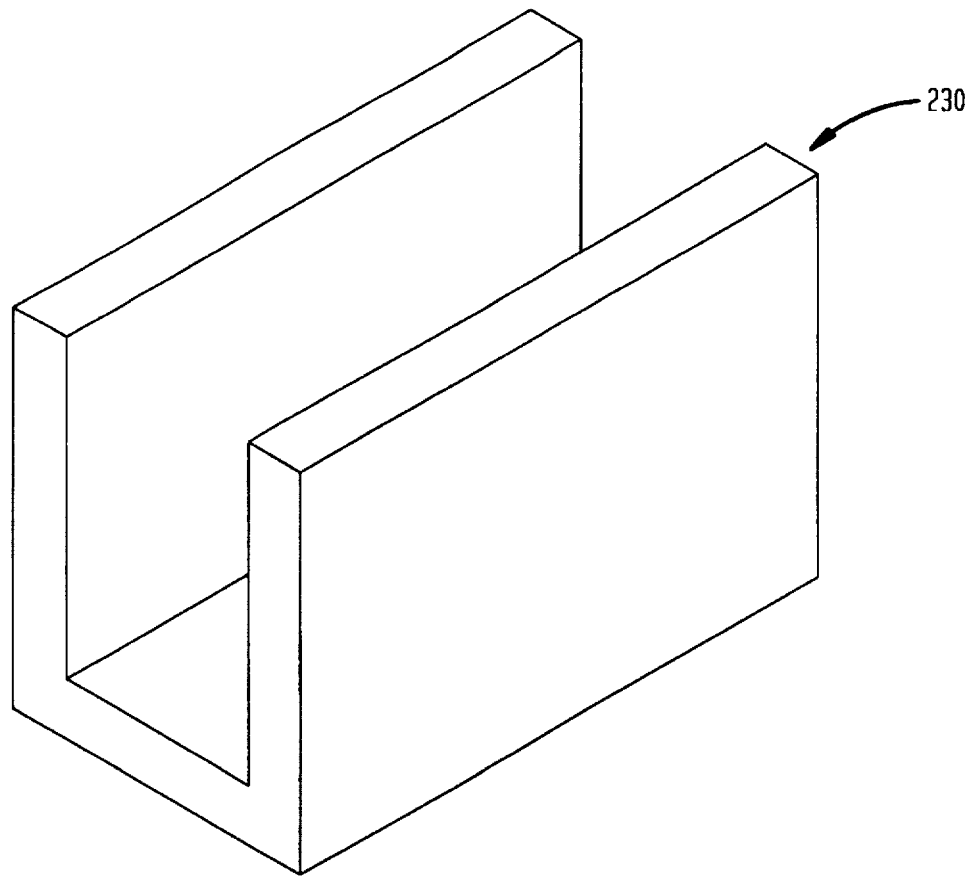
FIG. 3 an isometric view of a parallel fin capacitor according to one embodiment of the present invention.

A second polysilicon layer (Poly-2) having an n-type conductivity contacts the source region and forms the bitline. Layers of WSi 216, thin oxide 218, such as TEOS, and $Si_yN_x$ 220, such as $Si_3N_4$, cover the bitline. The exposed portions of the bitline are covered with TEOS spacers 222. Small TEOS regions 224 contact portions of the drain and source regions. A capacitor 230 having a parallel fin construction contacts the drain region. The capacitor comprises a third polysilicon layer (Poly-3) doped to an n-type conductivity, a thin dielectric layer 232, such as silicon nitride film/oxide film (NO) or oxide film/silicon nitride film/oxide film (ONO), and a fourth polysilicon layer (Poly-4) doped to a n-type conductivity. FIG. 3 is an isometric view of the parallel fin capacitor 230.

FIGS. 4A–4J are cross-sectional views illustrating a preferred method manufacturing the DRAM cell of FIG. 2 according to the present invention.

Figure 4A:
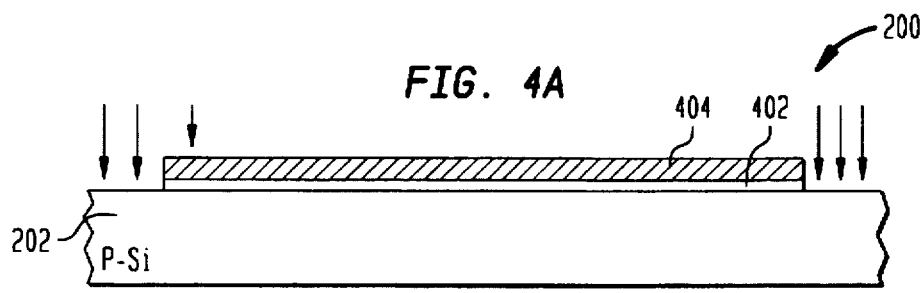
FIGS. 4A–4J illustrate a first preferred method of manufacturing the DRAM of FIG. 2.

FIG. 4A shows a p-type silicon substrate 202. A person skilled in the art readily understands that an n-type substrate could also be used. If an n-type substrate is used, the conductivity types of the different conductive components have a conductivity opposite that described here.

A pad oxide film 402 having a thickness in the range of 150–350 Å is grown on the substrate 202 using the thermal oxidation method. A silicon nitride ($Si_yN_x$) film 404 having a thickness in the range of 1.000–2.000 Å is deposited over the pad oxide film 402 using the chemical vapor deposition (CVD) method.

Using photolithographic techniques, portions of the pad oxide film 402 and nitride film 404 are removed by plasma etching to expose the substrate in selected locations.

Figure 4B:
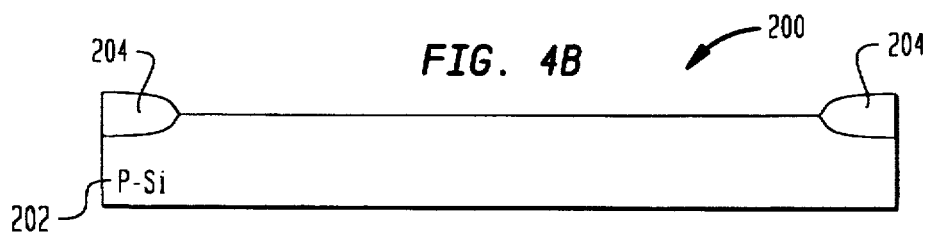

FIG. 4B shows that a field oxide region (FOX) 204 is grown at the exposed locations. The FOX is preferably grown using the thermal oxidation method. The silicon nitride film is etched away using wet etching and the pad oxide film is removed.

Figure 4C:
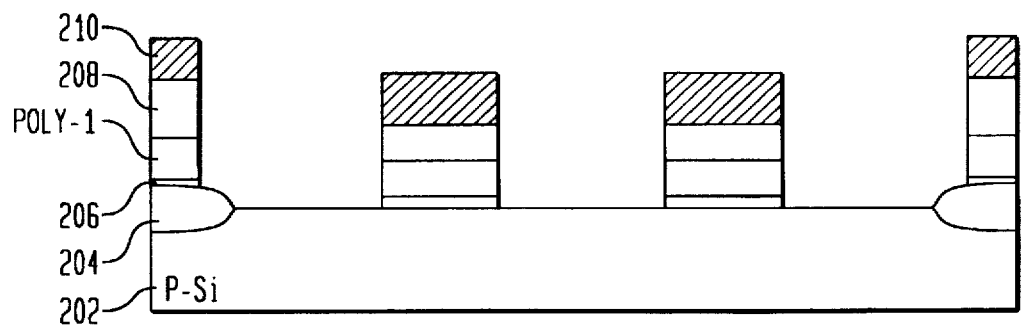

FIG. 4C shows a layer of gate oxide film 206 having a thickness in the range of 50–150 Å grown on the substrate using the thermal oxidation method. A Poly-1 layer, which is preferably polysilicon, having a thickness in the range of 500–1,500 Å is deposited on the gate oxide film using the CVD method. The Poly-1 layer is doped to an n-type conductivity type using in-situ gas doping sources. A layer of tungsten silicide (WSi) 208 having a thickness in the range of 500–1,500 Å is deposited on the doped Poly-1 layer using the CVD method. An insluating layer 210, such as $SiO_2$ or SiN, having a thickness in the range of 500–2,000 Å is deposited on top of the WSi layer, using the CVD method. Using photolithographic techniques, these layers are masked and etched away using RIE or plasma etching to form regions which make up the gate region of the DRAM cell.

Figure 4D:
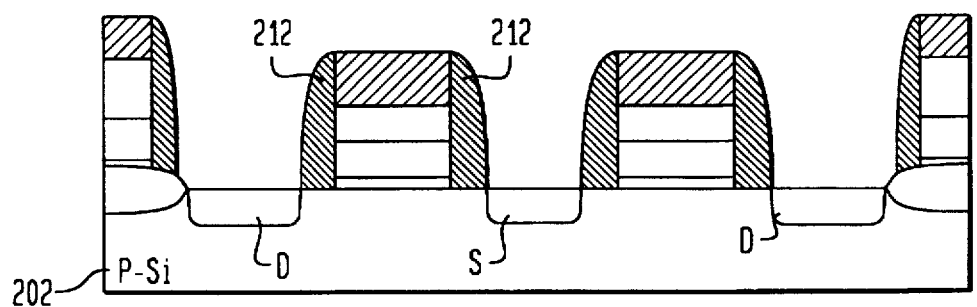

FIG. 4D shows that a second layer of $SiO_2$, or TEOS, having a thickness of the range 1,000–2,000 Å is deposited over the entire cell using the CVD method. This layer is anisotropically etched to form spacers 212 on the sides of the gate regions. Drain and source regions are formed in any well-known manner.

Figure 4E:
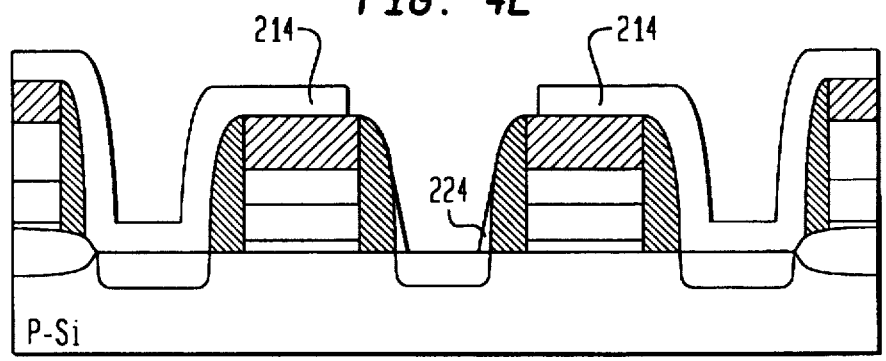

FIG. 4E shows an insulating layer of TEOS 214 having a thickness in the range of 1,000–2,000 Å and deposited using the CVD method. Using photolithography, this layer is masked and etched back using RIE or plasma etching to expose the source region. A portion 224 of the TEOS layer remains between the spacers 212 and the source region.

Figure 4F:
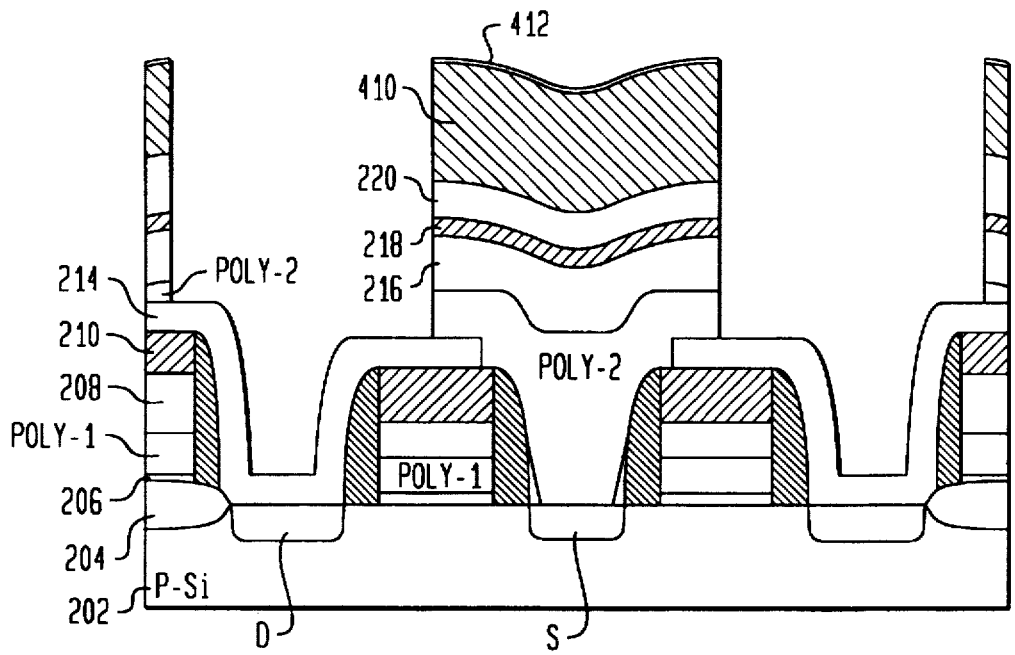

FIG. 4F shows a Poly-2 layer, which is preferably polysilicon, having a thickness in the range of 500–2,000 Å is deposited over the entire cell, including the exposed source region, using the CVD method. The Poly-2 layer is doped with in-situ doping gas sources to make it an n-type conductivity. The Poly-2 layer contacts the exposed source region. A layer of tungsten silicide (WSi) 216 having a thickness in the range of 500–1,500 Å is deposited on the doped Poly-2 layer using the CVD method. A thermal oxide layer, or thin TEOS layer, 218 having a thickness in the range of 100–500 Å is grown on top of the WSi layer. A layer of $Si_yN_x$ 220, such as $Si_3N_4$, having a thickness in the range of 1,000–2,000 Å is deposited on the oxide layer 218 using, for example, chemical vapor deposition (CVD). The oxide (or TEOS) layer 218 is provided for stress relief because differences in thermal expansions between the WSi layer 216 and the $Si_yN_x$ 220 prevents the $Si_yN_x$ from being deposited directly onto the WSi. A thick oxide layer 410, such as SiO, having a thickness in the range of 3,000–6,000 Å is deposited onto the $Si_yN_x$ layer using the CVD method. A thin layer of amorphous silicon or polysilicon 412 having a thickness of 500 Å is deposited onto the thick oxide layer 410 using the CVD method. These layers are masked and etched back using RIE or plasma etching to define a bitline contacting the source region. These layers are used to "build" the parallel fin capacitors.

Figure 4G:
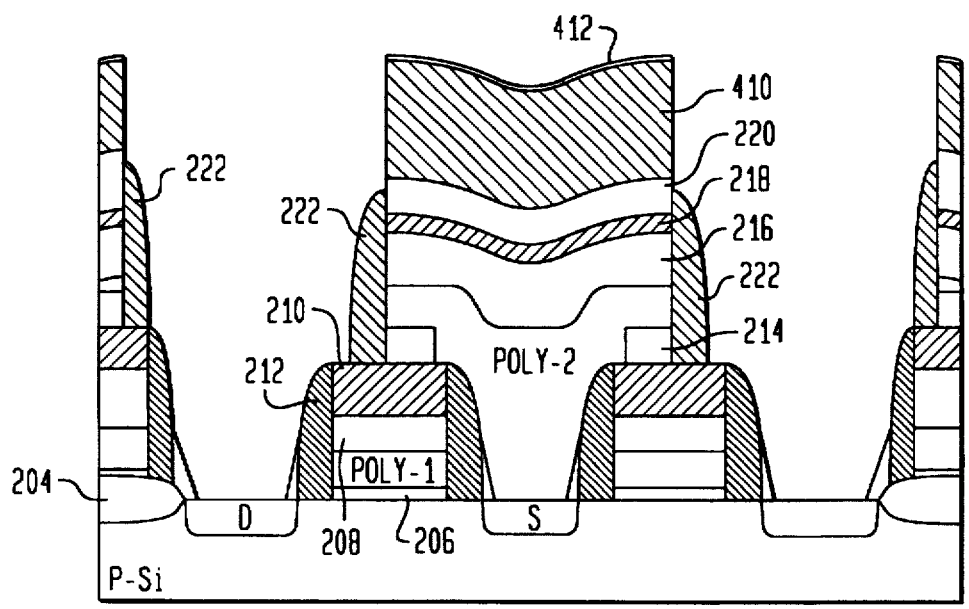

FIG. 4G shows that the exposed TEOS 214 is etched using RIE or plasma etching, exposing the drain regions. Small TEOS layers 224 remain between the spacers 212 and the drain region. A second layer of TEOS, or thermal oxide, having a thickness of the range 500–2,000 Å is deposited over the entire cell using the CVD method. This layer is anisotropically etched with highly selective oxide etching rate to form spacers 222 on the sides of the bitline. The layer 412 acts as an oxide etch barrier to prevent layer 410 from being etched away and thus maintains its profile.

Figure 4H:
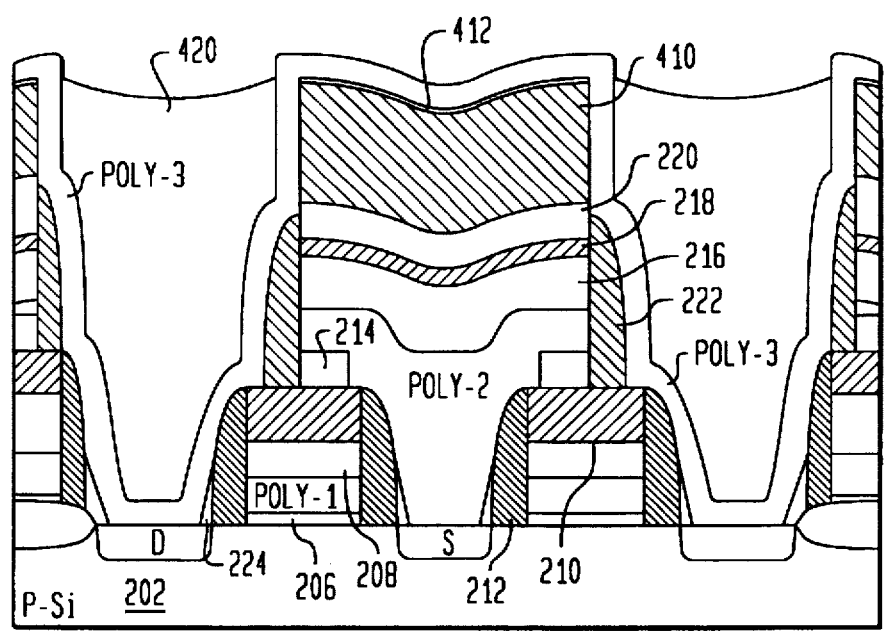

FIG. 4H shows that a Poly-3 layer, which is preferably polysilicon, having a thickness of the range 300–1,000 Å is deposited onto the entire cell using the CVD method. The Poly-3 layer is doped to an n-type conductivity using in-situ doping gas sources. This Poly-3 layer will form one of the capacitor electrodes. Using CVD or spin-coating deposition method, an oxide or sacrifice layer 420, such as SOG, photoresist, polyimide or BPSG, having a thickness in the range of 1,000–10,000 Å is deposited over the entire cell, filling the cavities within the Poly-3 layer and up to the dashed line shown in the figure. The oxide is planarized and etched back using RIE or plasma etching to expose the top of the Poly-3 layer, as shown in FIG. 4H.

Figure 4I:
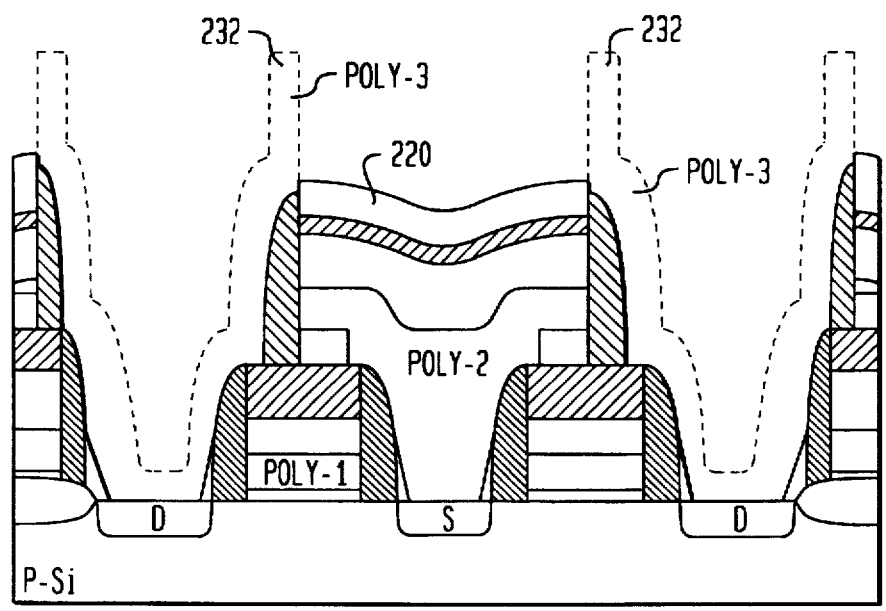

FIG. 4I shows that the exposed portions of the Poly-3 layer and layer 412 are etched back using RIE or plasma etching. This etching isolates the Poly-3 layer into a number of separate capacitor electrodes. The oxide filling the cavities is removed using selective oxide or polymer to polysilicon RIE. The amorphous silicon layer 412 and thick oxide layer 410 are etched back using selective oxide to polysilcon and SiN RIE. Using photolithographic techniques, the Poly-3 layer is masked and etched again. This is done to separate the adjacent capacitor nodes along the Poly-2 lines. A layer of HSG is deposited on the Poly-3 layer to give the electrode a non-uniform surface and thus provide additional surface area. The HSG is etched back using selective polysilicon to oxide RIE. A dielectric layer 232, such as ONO or NO, having a thickness of 40–60 Å, is deposited onto the Poly-3 layer using CVD.

Figure 4J:
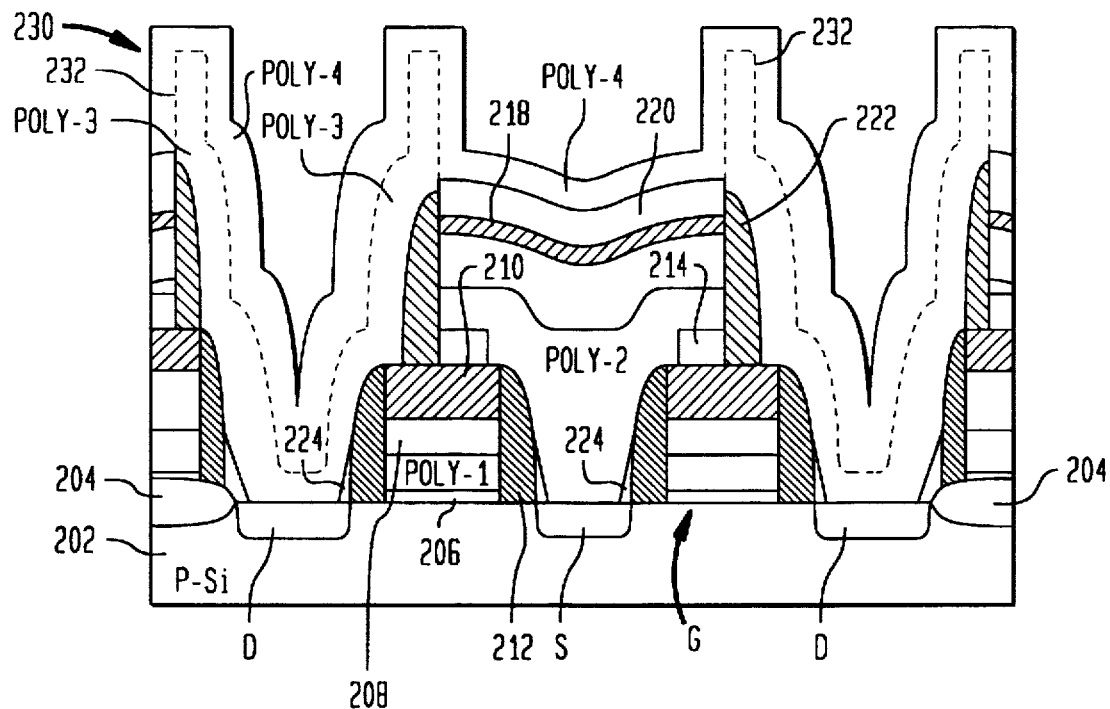

FIG. 4J shows that a Poly-4 layer, which may be polysilicon, having a thickness range of 1,000–2,000 Å is deposited onto the dielectric layer 232 using CVD method. This Poly-4 layer is doped to an n-type conductivity type by doping it with in-situ doping gas sources. Using photolithographic techniques, the Poly-4 layer is masked and etched back using RIE or plasma with selective polysilcon to oxide etching.

This cell manufacturing process is completed using well-known back end processes not described here.

Figure 5:
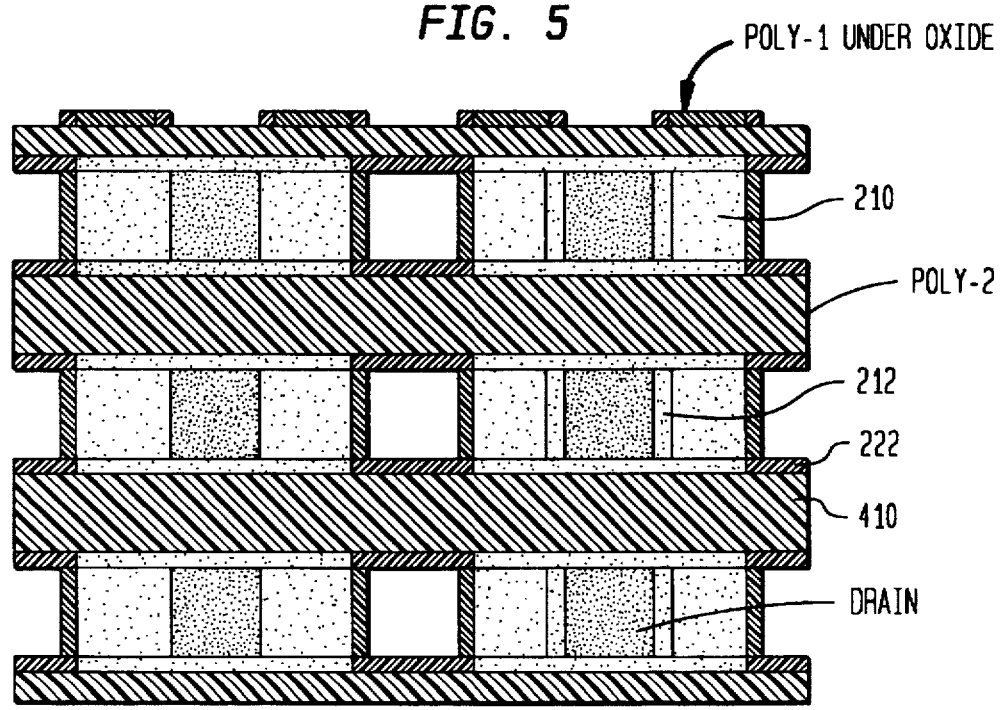
FIG. 5 is a top elevational view of an array of DRAMs of FIG. 4G.

FIG. 5 is a top plan view of a DRAM cell array as seen in FIG. 4G. The drain is exposed. The gate spacers 212 are next to the exposed drain. The Poly-1 gate is beneath an oxide layer 210. The Poly-2 bitline runs between the drains and contacts the source, which is not visible in FIG. 5. Bitline spacers 222 are alongside the bitline and a thick oxide layer 410 covers the bitline.

FIGS. 6A–6H illustrate a second preferred embodiment 600 of the present invention and a method of manufacturing it. Note that for clarity, FIGS. 6A–6H omit some layers. The gate oxide layer, for example, is not shown.

Figure 6E:
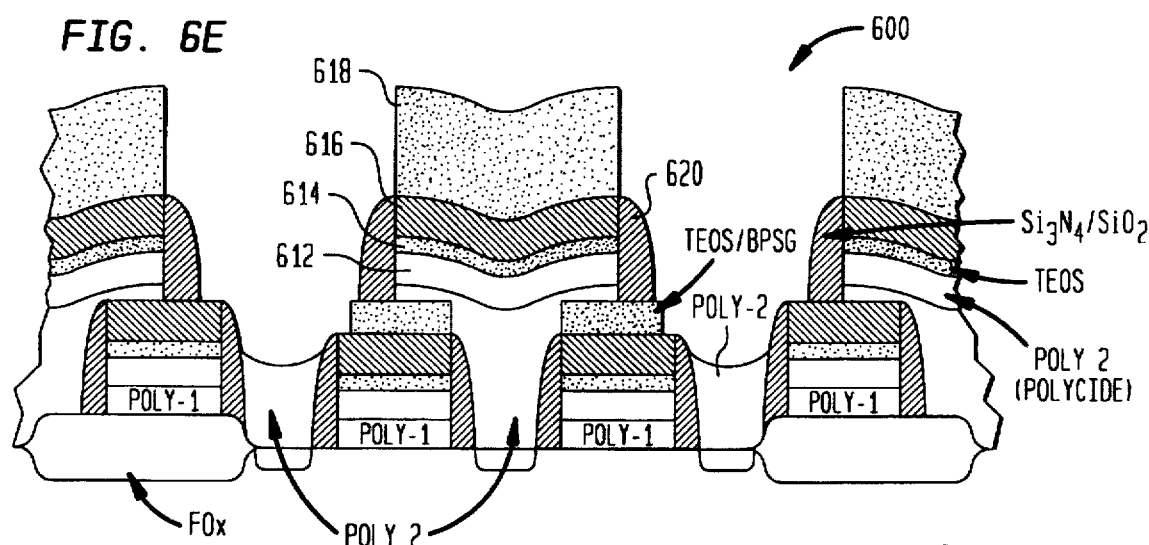
Figure 6F:
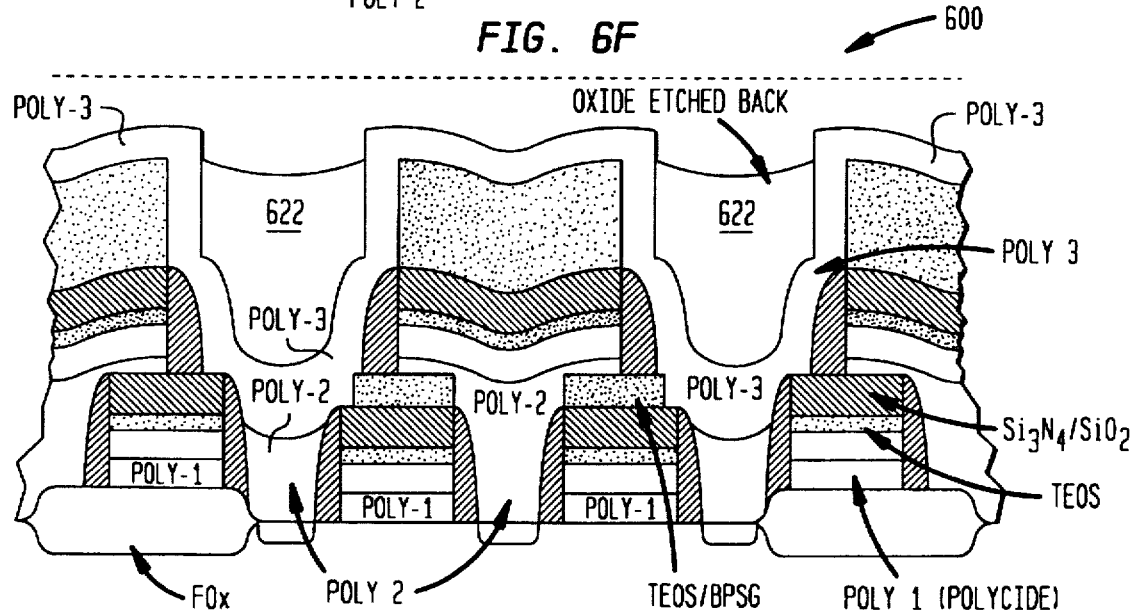
Figure 6G:
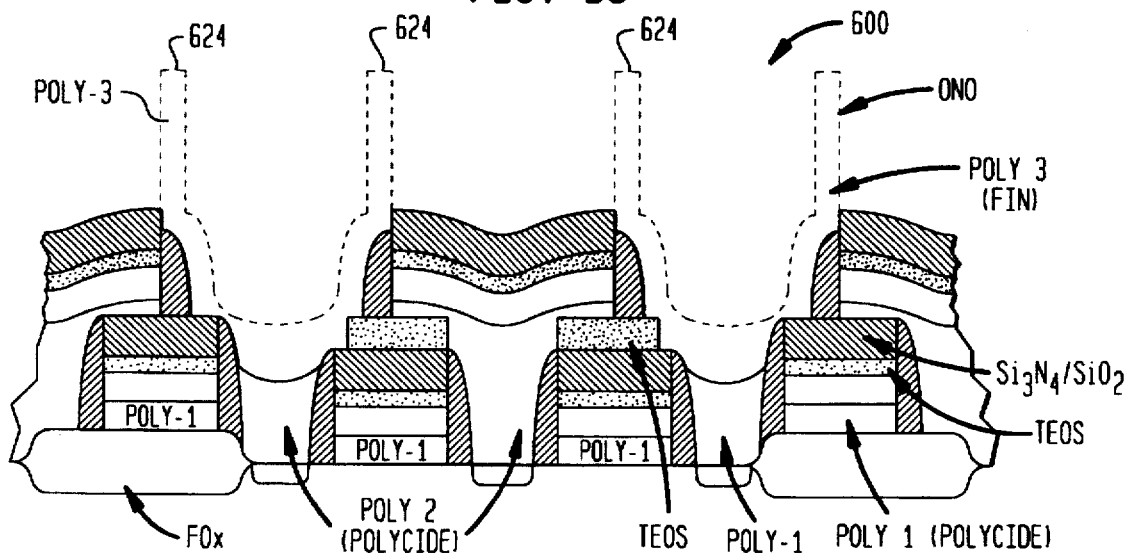
Figure 6H:
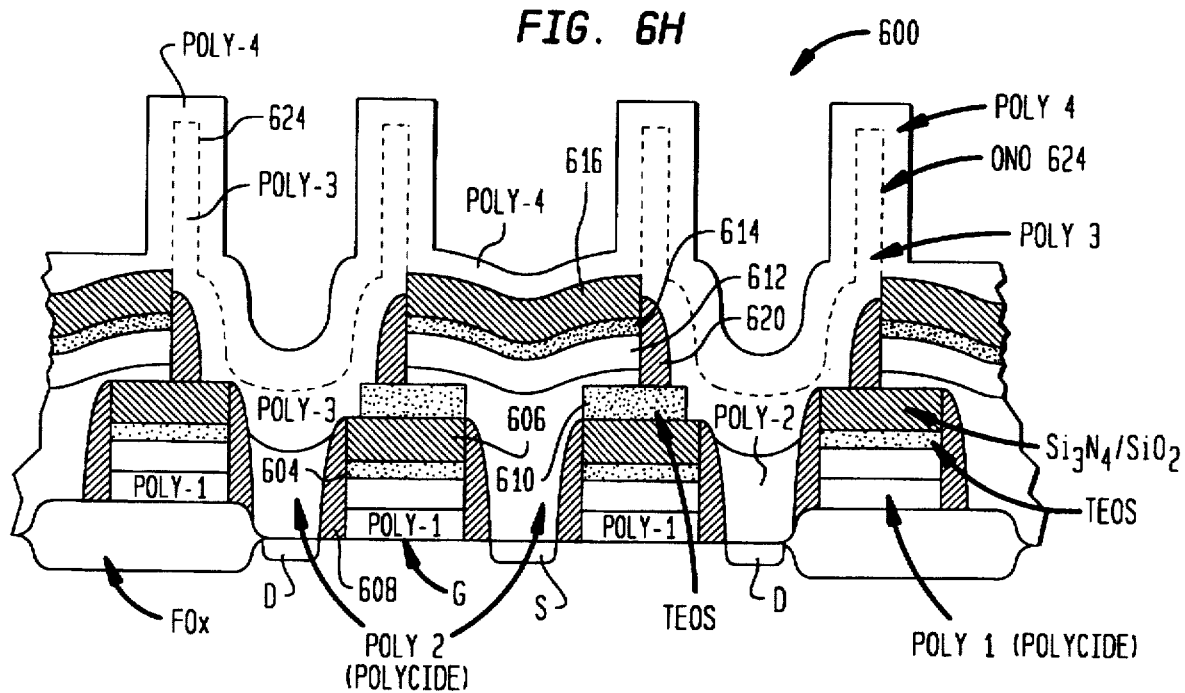

As seen in FIG. 6H, the second embodiment of the inventive DRAM cell 600 is formed on a silicon substrate (not shown) having a first conductivity type. Field oxide (FOX) regions are defined in the substrate to separate DRAM cells. Drain and source regions (D,S) are formed in the substrate. On the substrate surface and between the drain and source, a gate region (G) is formed. The gate region comprises a gate oxide (not shown), a Poly-1 layer doped to have a second conductivity type opposite the first conductivity type, a tungsten silicide (WSi) layer 602, an oxide layer 604, and a $SiO_2$ or SiN layer 606. $SiO_2$ or SiN spacers 608 cover the sides of the gate regions. Above the gate region is an insulating TEOS or BPSG (borophosilicate) layer 610. A Poly-2 layer having the second conductivity type contacts the source and drain regions. The Poly-2 layer forms a bitline where it contacts the source region. Layers of WSi 612, thermal oxide, or thin TEOS 614, and $Si_yN_x$ 616, such as $Si_3N_4$, cover the bitline. The sides of the bitline are covered with $Si_yN_x$ spacers 620.

A capacitor having a parallel fin construction contacts the Poly-2 layer contacting the drain region. The capacitor comprises a Poly-3 layer doped to the second conductivity type, a thin dielectric layer 624, such as NO or ONO, and a Poly-4 layer doped to the second conductivity type.

Before FIG. 6A, the FOX region, gate oxide layer, and a Poly-1 layer are formed in the same manner as described above. In FIG. 6A, the Poly-1 layer, which is preferably polycide, having a thickness in the range of 500–1,500 Å, is deposited and doped as described above. A tungsten silicide (WSi) layer 602 having a thickness in the range of 500–1, 500 Å is deposited on the doped Poly-1 layer using the CVD method. An oxide layer 604 is grown on top of the WSi layer. A layer of $Si_yN_x$ 606, such as $Si_3N_4$, or $SiO_2$, having a thickness in the range of 100–500 Å is deposited on the oxide layer 604 using, for example, CVD. The oxide layer 604 is provided for stress relief because differences in thermal expansions between $Si_yN_x$ and WSi prevent the $Si_yN_x$ from being deposited directly onto WSi. These layers are masked and etched away using RIE or plasma etching to form regions which make up the gate region of the DRAM cell.

FIG. 6B shows that a second layer of $Si_yN_x$ or $SiO_2$ is deposited over the entire cell having a thickness of the range 1,000–2,000 Å, using the CVD method. This layer is anisotropically etched to form spacers 608 on the sides of the gate regions. Drain and source regions are formed in any well-known manner.

FIG. 6C shows that a layer of TEOS or BPSG (borophosphosilicate) 610, having a thickness in the range of 1,000–4,500 Å is deposited using the CVD method over the entire cell. Using a photolithographic technique, the TEOS or BPSG is masked and etched using RIE or plasma etching. The remaining TEOS (or BPSG) is on top of the gate region adjacent to the source. This exposes the drain and source regions.

FIG. 6D shows a Poly-2 layer, which is preferably polycide, having a thickness in the range of 500–2,000 Å is deposited over the entire cell using the CVD method. The Poly-2 layer contacts the exposed drain and source regions. The Poly-2 layer is preferably doped to an n-type conductivity using, for example, in-situ doping gas sources. A layer of tungsten silicide (WSi) 612 having a thickness in the range of 500–1,500 Å is deposited on the doped Poly-2 layer using the CVD method. A thermal oxide layer, or thin TEOS layer, 614 having a thickness in the range of 100–500 Å is grown on top of the WSi layer. A layer of $Si_yN_x$, such as $Si_3N_4$, 616 having a thickness in the range of 1,000–2,000 Å is deposited on the oxide layer 614 using, for example, CVD. A thick oxide layer 618 such as SiO, having a thickness in the range of 3,000–9,000 Å is deposited onto the $Si_yN_x$ layer 616 using the CVD method. Using photolithographic methods, the SiO, $Si_yN_x$, TEOS, and WSi layers are masked and etched using RIE or plasma etching. The remaining layers cover the Poly-2 bitline area over the source. The remaining exposed Poly-2 is partially etched and recessed so that a concave portion of Poly-2 remains over the drain regions.

FIG. 6E shows that a second layer of $Si_yN_x$, having a thickness in the range of 300–1,000 Å, is deposited over the entire cell using the CVD method. The layer is anisotropically etched to form spacers 620 along the sides of the bitline.

FIG. 6F shows that a Poly-3 layer having a thickness in the range of 300–1,000 Å, is deposited over the cell using the CVD method. The Poly-3 layer is preferably doped to an n-type conductivity using, for example, in-situ doping gas sources. Note that the Poly-3 layer contacts the Poly-2 layers to create a single conductive region contacting the drain regions. An oxide layer 622 such as SOG, polyimide, photoresist, or BPSG is deposited, using the CVD or spin-coating method, over the entire cell filling the cavities within the Poly-3 layer and up to the dashed line shown in the figure. The oxide is planarized and etched back using RIE or plasma etching, as shown in FIG. 6F, to expose the top of the Poly-3 layer.

FIG. 6G shows that the exposed portions of the Poly-3 layer are etched back using RIE or plasma etching. This etching isolates the Poly-3 layer into a number of separate capacitor electrodes. The oxide filling the cavities is removed using selective oxide or polymer to polysilicon etching. The thick oxide layer 618 is etched back using selective oxide to SiN and polysilicon etching. A layer of HSG is deposited on the Poly-3 layer to provide additional surface area. The HSG is etched back using RIE or plasma etching. A dielectric layer 624, such as ONO or NO, having a thickness of 40–60 Å, is deposited onto the Poly-3 layer using CVD. Using photolithographic techniques, the Poly-3 layer is masked and etched again to separate the adjacent capacitors along the Poly-2 lines.

FIG. 6H shows that a Poly-4 layer, which is preferably polysilicon, having a thickness range of 1,000–2,000 Å, is deposited onto the dielectric layer 624 using CVD. The Poly-4 layer is preferably doped to an n-type conductivity using, for example, in-situ doping gas sources. Using photolithographic techniques, the Poly-4 layer is masked and etched back using RIE or plasma etching.

This DRAM cell manufacturing process is completed using well-known back end processes not described here. The method disclosed in relation to FIGS. 6A–6H does not require separate deposition/etching steps to first expose the source and form the bitline, and then expose the drain and form the capacitor (see FIGS. 4E–4G). Thus, the DRAM cell manufacturing process described in relation to FIGS. 6A–6H requires fewer processing steps.

A DRAM is disclosed having its capacitance increased by using parallel fin capacitors. Two efficient methods are disclosed for manufacturing DRAMs with these fins.

The above described embodiments of the invention are intended to be illustrative only. Numerous alternative embodiments may be devised by those skilled in the art without departing from the spirit and scope of the following claims.

We claim:

1. A method for manufacturing a dynamic random access memory (DRAM) device, comprising the steps of:
   a. creating a gate having a first conductivity type on a substrate having a second conductivity type opposite the first conductivity type;
   b. using the gate as a mask, creating in the substrate a source region and a drain region;
   c. covering the substrate with a first etchable material and etching the first etchable material to expose the source region;
   d. forming a bitline in contact with the exposed source region, said bitline comprising a polysilicon layer, a tungsten silicide layer, an oxide layer, and a $Si_3N_4$ layer;

e. covering the entire substrate with a second etchable material and etching the second etchable material, forming parallel lines along and on top of the bitline and to expose the drain region;

f. forming a first capacitor electrode on the parallel lines and in contact with the drain region, said parallel lines comprising a thick oxide layer and an amorphous silicon or polysilicon layer;

g. depositing a dielectric layer over the first capacitor electrode; and h. forming a second capacitor electrode over the dielectric layer.

2. The method of claim 1, wherein the step of creating the gate comprises the steps of:

a. growing a gate oxide on a surface of the substrate;

b. depositing a first polysilicon (Poly-1) layer on the gate oxide;

c. doping the Poly-1 layer to the first conductivity type;

d. depositing a layer of tungsten silicide (WSi) on the doped Poly-1 layer;

e. depositing an oxide layer on the WSi layer; and f. etching the gate oxide, Poly-1 layer, WSi layer, and oxide layer into a gate region.

3. The method of claim 2, wherein the step of creating the gate further comprises the step of:

a. after depositing the oxide layer, depositing a second oxide layer over the gate region; and b. anisotropically etching the second oxide layer.

4. The method of claim 1, wherein the step of forming the bitline further comprises:

a. depositing a second polysilicon (Poly-2) layer on the first etchable material and exposed source region;

b. doping the Poly-2 layer to the first conductivity type;

c. depositing a tungsten silicide layer (WSi) on the doped Poly-2 layer;

d. growing an oxide layer on the WSi layer;

e. depositing a silicon nitride layer on the oxide layer; and f. etching the Poly-2 layer, WSi layer, oxide layer, and silicon nitride layer to form the bitline.

5. The method of claim 4, wherein after the step of etching the layers to form the bitline:

a. etching the first etchable material;

b. depositing a second oxide layer on sides of the bitline; and c. anisotropically etching the second oxide layer.

6. The method of claim 4, wherein the step of forming parallel lines comprises:

a. depositing a thick oxide layer on the silicon nitride layer;

b. depositing an amorphous silicon or polysilicon layer on the thick oxide layer;

c. etching the thick oxide layer and the amorphous or polysilicon layer during the step of forming the bitline.

7. The method of claim 1, wherein the step of forming the first capacitor electrode comprises the steps of:

a. depositing a third polysilicon layer (Poly-3) on the parallel lines and in contact with the drain region;

b. doping the Poly-3 layer to the first conductivity type; and c. etching a top of the Poly-3 layer.

8. The method of claim 7, wherein the step of forming the first capacitor electrode further comprises after etching the top of the Poly-3 layer, depositing a layer of hemisphere grain polysilicon on the first capacitor electrode.

9. The method of claim 1, wherein the step of forming the second capacitor electrode comprises the steps of:

a. depositing a fourth polysilicon layer (Poly-4) on the dielectric layer;

b. doping the Poly-4 layer to the first conductivity type; and c. etching the doped Poly-4 layer.

10. A method for manufacturing a dynamic random access memory (DRAM device, comprising the steps of:

a. creating a gate having a first conductivity type on a substrate having a second conductivity type opposite the first conductivity type;

b. using the gate as a mask, creating in the substrate a source region and a drain region;

c. covering the substrate with a layer of conductive material having the first conductivity type and partially etching the conductive material, forming a bitline contacting the source region and to form a concave layer contacting the drain region, said bitline comprising a polysilicon layer, a tungsten silicide layer, an oxide layer, and a silicon nitrate layer;

d. covering the entire substrate with an etchable material and etching the etchable material to form parallel lines along and on top of the bitline and to expose the conductive material contacting the drain region;

e. forming a first capacitor electrode on the parallel lines and in contact with the conductive material contacting the drain region;

f. depositing a dielectric layer over the first capacitor electrode; and g. forming a second capacitor electrode over the dielectric layer.

11. A method for manufacturing a dynamic random access memory (DRAM) device, comprising the steps of:

a. creating a gate having a first conductivity type on a substrate having a second conductivity type opposite the first conductivity type, said method of creating said gate further comprising:

1. growing a gate oxide on a surface of the substrate;

2. depositing a first polycide (Poly-1) layer on the gate oxide;

3. doping the Poly-1 layer to the first conductivity type;

4. depositing a layer of tungsten silicide (WSi) on the doped Poly-1 layer;

5. depositing an oxide layer on the WSi layer;

6. depositing a silicon nitride layer on the oxide layer; and 7. etching the gate oxide, Poly-1 layer, WSi layer, oxide layer, and silicon nitride layer into a gate region;

b. using the gate as a mask, creating in the substrate a source region and a drain region;

c. covering the substrate with a layer of conductive material having the first conductivity type and partially etching the conductive material, forming a bitline contacting the source region and to form a concave layer contacting the drain region, said bitline comprising a polysilicon layer, a tungsten silicide layer, an oxide layer, and a silicon nitrate layer;

d. covering the entire substrate with an etchable material and etching the etchable material to form parallel lines along and on top of the bitline and to expose the conductive material contacting the drain region;

e. forming a first capacitor electrode on the parallel lines and in contact with the conductive material contacting the drain region;

f. depositing a dielectric layer over the first capacitor electrode; and g. forming a second capacitor electrode over the dielectric layer.

12. The method of claim 11, wherein the step of creating the gate biter comprises:

a. depositing a second silicon nitride layer on the gate region; and b. anisotropically etching the second silicon nitride layer.

13. The method of claim 10, wherein the step of covering the substrate with conductive material further comprises:

a. depositing a second polycide (Poly-2) layer on the substrate; and b. doping the Poly-2 layer to the first conductivity type.

14. A method for manufacturing a dynamic random access memory (DRAM) device, comprising the steps of:

a. creating a gate having a first conductivity type on a substrate having a second conductivity type opposite the first conductivity type;

b. using the gate as a mask creating in the substrate a source region and a drain region;

c. covering the substrate with a layer of conductive material having the first conductivity type and partially etching the conductive material wherein said step of covering the substrate with a layer of conductive material further comprises:

1. depositing a second polycide (Poly-2) layer on the substrate; and 2. doping the Poly-2 layer to the first conductivity type.

d. forming a bitline contacting the source region and to form a concave layer contacting the drain region, wherein said step of forming the bitline further comprises:

1. depositing a tungsten silicide (WSi) layer on the doped Poly-2 layer;

2. growing an oxide layer on the WSi layer;

3. depositing the $Si_3N_4$ layer on the oxide layer; and 4. etching the Poly-2 layer, WSi layer, oxide layer, and $S_3N_4$ layer, forming the bitline.

e. covering the entire substrate with an etchable material and etching the etchable material to form parallel lines along and on top of the bitline and to expose the conductive material contacting the drain region;

f. forming a first capacitor electrode on the parallel lines and in contact with the conductive material contacting the drain region;

g. depositing a dielectric layer over the first capacitor electrode; and h. forming a second capacitor electrode over the dielectric layer.

15. The method of claim 10, wherein the step of forming a first capacitor electrode comprises:

a. depositing the third polysilicon layer (Poly-3) on the parallel lines and contact with the drain region;

b. doping the Poly-3 layer to the first conductivity type; and c. etching a top of the Poly-3 layer.

16. The method of claim 15, wherein the step of forming a first capacitor electrode further comprises after etching the top of the Poly-3 layer, depositing a layer of hemisphere grain polysilicon on the first capacitor electrode.

17. The method of claim 10, wherein the step of forming the second capacitor electrode comprises the steps of:

a. depositing a fourth polysilicon layer (Poly-4) on the dielectric layer;

b. doping the Poly-4 layer to the first conductivity type; and c. etching the doped Poly-4 layer.

\* \* \* \* \*